US006794867B1

(12) United States Patent
Block et al.

(10) Patent No.: US 6,794,867 B1
(45) Date of Patent: Sep. 21, 2004

(54) ISOTROPIC IMAGING OF VESSELS WITH FAT SUPPRESSION

(75) Inventors: Walter F. Block, Madison, WI (US); Thomas M. Grist, Madison, WI (US); Aiming Lu, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 0 days.

(21) Appl. No.: 10/461,227

(22) Filed: Jun. 13, 2003

(51) Int. Cl.[7] .................................................. G01V 3/00
(52) U.S. Cl. ....................................... 324/307; 324/309
(58) Field of Search .............................. 324/307, 309, 324/300, 312, 314, 318, 322; 600/410, 419

(56) References Cited

U.S. PATENT DOCUMENTS

| 5,909,119 A | * | 6/1999 | Zhang et al. ................ 324/309 |
| 6,307,368 B1 | | 10/2001 | Vasanawala et al. |
| 6,339,332 B1 | | 1/2002 | Deimling |
| 6,486,670 B2 | | 11/2002 | Heid |
| 6,487,435 B2 | | 11/2002 | Mistretta et al. |
| 6,552,542 B1 | * | 4/2003 | Overall ........................ 324/309 |
| 6,608,479 B1 | * | 8/2003 | Dixon et al. ................. 324/307 |

OTHER PUBLICATIONS

Multi–echo Projection Reconstruction for Real–time Cardiac MRI: Comparison of Echo Trajectories, Peters, et al., 1 sheet.
The Use of Measured K–space Trajectories For Reconstruction Of Radial MRI Data, Dale et al., Proc. Intl. Soc. Mag. Reaon. Med. 10 (2002), 1 sheet.
Linear Combination Steady–State Free Precision MRI, Vasanawala, et al., Mag. Reson. in Med. 43–82–90 (2002).
Non–contrast–enhanced MR Angiography with Balanced turbo field echo (b–TFE) sequence: Comparison of source images, full MIP and Parallel MIP, Proc. Intl. Soc. Mag Reson Med 10 (2002) Nagayama et al 1 sheet.
MR Fluoroscopy Using Projection Reconstruction Multi-–Gradient Echo (prMGE) MRI, Mag. Reson. in Med. 42:324–334 (1999), Rasche et al.
Real–time Cardiac Cine Imaging With SPIDER: Steady–State Projection Imaging With Dynamic Echo–Trained Readout, Mag. Reson. in Med. 46:1059–1066 (2001), Larson et al.
Real–Time Interactive Radial Multi–Echo Steady State Free Precessing (SSFP) Imaging, Proc. Intl. Soc. Mag. Reson. Med. 10 (2002), Schaeffter, et al, 1 sheet.
Simple Correction Method for K–space Trajectory Deviations in MRI, Article No. MN981396, Journal of Mag. Reson. 132, 150–153 (1998), Duyn et al.

* cited by examiner

Primary Examiner—Louis Arana
(74) Attorney, Agent, or Firm—Quarles & Brady LLP

(57) ABSTRACT

Two images are acquired using a three-dimensional projection reconstruction, SSFP pulse sequence. Different RF phase cycling patterns are used to acquire each image and a fat suppressed water image is produced by combining the two images. Data acquisition efficiency is increased by aquiring k-space data during substantially the entire readout gradient waveform produced during the SSFP pulse sequence.

15 Claims, 6 Drawing Sheets

ISOTROPIC IMAGING OF VESSELS WITH FAT SUPPRESSION

STATEMENT REGARDING FEDERALLY SPONSORED RESEARCH

This invention was made with government support under Grant No. HL62425 awarded by the National Institute of Health. The United States Government has certain rights in this invention.

BACKGROUND OF THE INVENTION

The field of the invention is nuclear magnetic resonance imaging (MRI) methods and systems. More particularly, the invention relates to steady state free precession (SSFP) methods for acquiring MRI data.

When a substance such as human tissue is subjected to a uniform magnetic field (polarizing field $B_0$), the individual magnetic moments of the spins in the tissue attempt to align with this polarizing field, but process about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_1$. A signal is emitted by the excited spins after the excitation signal $B_1$ is terminated, this signal maybe received and processed to form an image.

When utilizing these signals to produce images, magnetic field gradients ($G_x$ $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

Most MRI scans currently used to produce medical images require many minutes to acquire the necessary data. The reduction of this scan time is an important consideration, since reduced scan increases patient throughput, improves patient comfort, and improves image quality by reducing motion artifacts. There is a class of pulse sequences which have a very short repetition time (TR) and result in complete scans which can be conducted in seconds rather than minutes. Whereas the more conventional pulse sequences have repetition times TR which are much greater than the spin-spin relaxation constant $T_2$ so that the transverse magnetization has time to relax between the phase coherent excitation pulses in successive sequences, the fast pulse sequences have a repetition time TR which is less than $T_2$ and which drives the transverse magnetization into a steady-state of equilibrium. Such techniques are referred to as steady-state free precession (SSFP) techniques.

With the recent introduction of high performance gradient systems on commercially available MRI systems these SSFP imaging pulse sequences have received more attention. Not only do they significantly shorten scan time, but they also have relatively high SNR while providing $T_2$-like contrast based on the $T_2/T_1$ ratio of tissues.

Two major problems are associated with the SSFP acquisition method. First, the images produced have undesirably bright lipid signals due to the high $T_2/T_1$ ratio of fat spins. The bright signal complicates clinical interpretation and obscures nearby tissues of greater clinical significance. Second, when using SSFP pulse sequences signal dropout and banding artifacts can appear in regions of $B_0$ field inhomogeneity. To reduce banding artifacts and maximize signal-to-noise (SNR) efficiency, an extremely short repetition time ("TR") is usually desired.

Two methods to suppress fat in SSFP images are described in U.S. Pat. No. 6,307,368. In the Fluctuating Equilibrium MR (FEMR) method, RF phase cycling creates transverse magnetization that fluctuates between water and fat signal on alternating pulse sequences. The second method, Linear Combination SSFP (LCSSFP), acquires two image datasets with SSFP pulse sequences using different RF phase cycles and then linearly combines the datasets during the image reconstruction. With this approach, image data sets can be combined differently to create both fat and water images without a loss in SNR efficiency.

To operate properly the FEMR and LCSSFP fat suppression methods require the use of a SSFP pulse sequence having a very short repetition period(TR). Both FEMR and LCSSFP work best when a 180° phase shift occurs between fat and water spins during each TR interval. The ideal repetition time for perfect fat water separation at 1.5T, therefore, is approximately 2.2 ms. However, obtaining such a short TR is difficult without sacrificing readout resolution, which limits the applicability of the method.

SUMMARY OF THE INVENTION

The present invention is a method for increasing the data acquired with a SSFP pulse sequence having a short repetition rate (TR), and in particular, a method for acquiring NMR data with a projection reconstruction pulse sequence throughout the duration of its readout gradient waveform. By acquiring NMR data during both rephasing and dephasing lobes of the readout gradient waveform as well as ramps therebetween, the amount of data acquired during a short TR can be doubled. This translates into shorter scan times or higher resolution or higher SNR images.

Another aspect of the invention is the performance of a calibration scan prior to the image scan during which calibration data is acquired. This calibration data is employed to correct the acquired image data for inaccuracies caused by eddy currents. These corrections enable NMR signals to be acquired throughout the readout gradient waveform without producing significant image artifacts.

A general object of the invention is to increase the amount of NMR data that can be acquired during a short TR SSFP pulse sequence. Data can be acquired throughout the duration of the readout gradient waveform to sample more k-space data. Errors caused by sampling during the changes in readout gradient amplitude are corrected with information obtained during a calibration scan.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

DESCRIPTION OF THE PREFERRED EMBODIMENT

Figure 1:
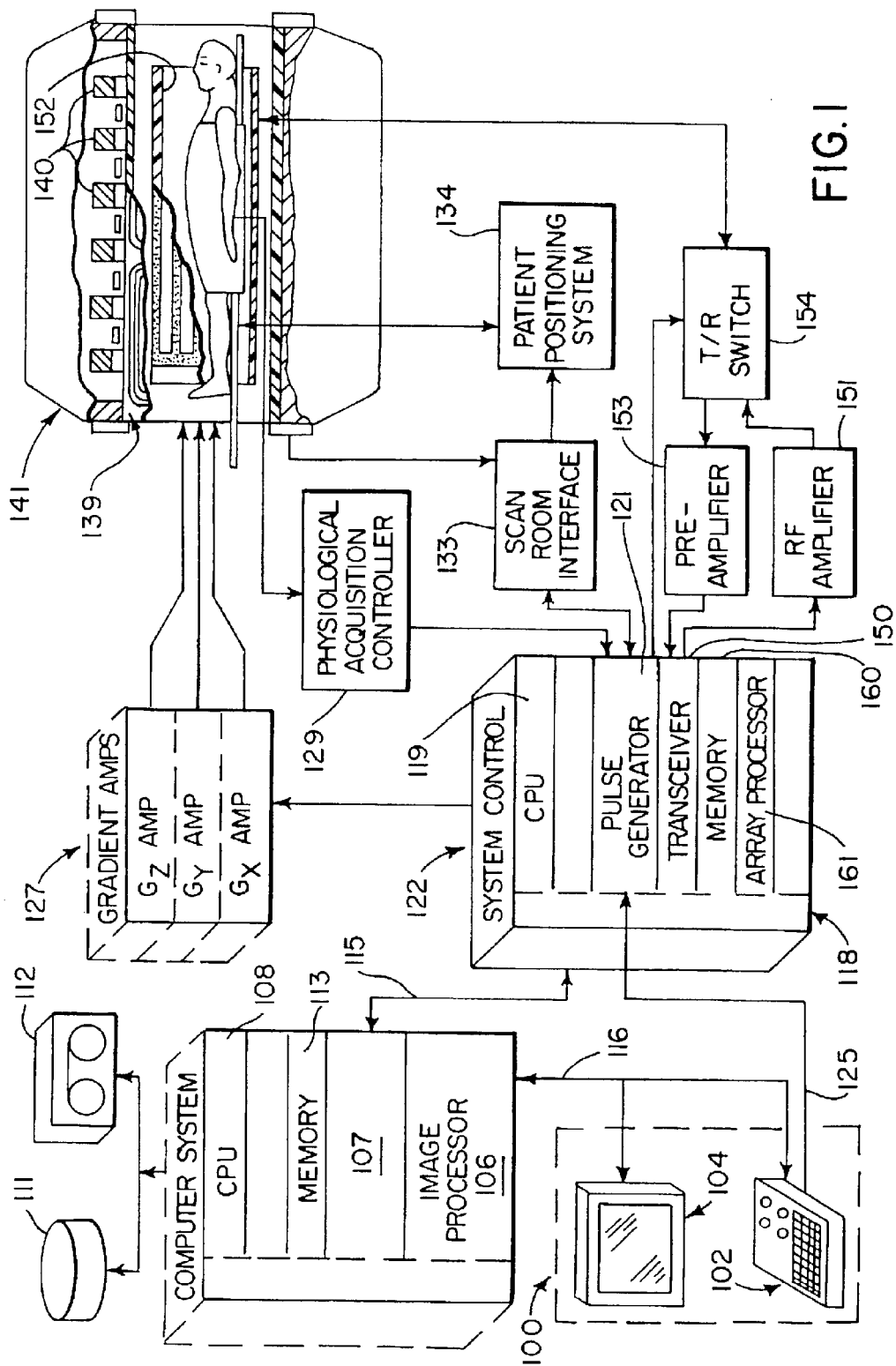
FIG. 1 is a block diagram of an MRI system which employs the present invention.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104.

Figure 2:
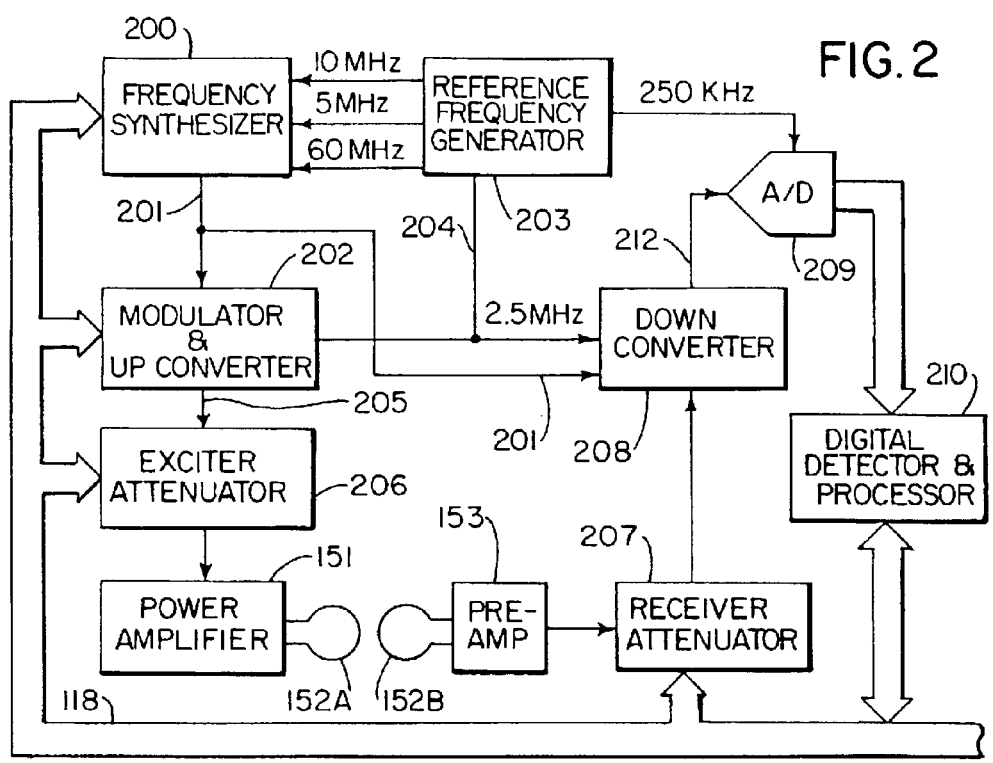
FIG. 2 is an electrical block diagram of the transceiver which forms part of the MRI system of FIG. 1.

Referring particularly to FIGS. 1 and 2, the transceiver 150 produces the RF excitation field B1 through power amplifier 151 at a coil 152A and receives the resulting signal induced in a coil 152B. As indicated above, the coils 152A and B may be separate as shown in FIG. 2, or they may be a single whodlebody coil as shown in FIG. 1. The base, or carrier, frequency of the RF excitation field is produced under control of a frequency synthesizer 200 which receives a set of digital signals (CF) from the CPU module 119 and pulse generator module 121. These digital signals indicate the frequency and phase of the RF carrier signal produced at an output 201. The commanded RF carrier is applied to a modulator and up converter 202 where its amplitude is modulated in response to a signal R(t) also received from the pulse generator module 121. The signal R(t) defines the envelope of the RF excitation pulse to be produced and is produced in the module 121 by sequentially reading out a series of stored digital values. These stored digital values may, in turn, be changed from the operator console 100 to enable any desired RF pulse envelope to be produced.

The magnitude of the RF excitation pulse produced at output 205 is attenuated by an exciter attenuator circuit 206 which receives a digital command, TA, from the backplane 118. The attenuated RF excitation pulses are applied to the power amplifier 151 that drives the RF coil 152A. For a more detailed description of this portion of the transceiver 122, reference is made to U.S. Pat. No. 4,952,877 which is incorporated herein by reference.

Referring still to FIGS. 1 and 2 the signal produced by the subject is picked up by the receiver coil 152B and applied through the preamplifier 153 to the input of a receiver attenuator 207. The receiver attenuator 207 further amplifies the signal by an amount determined by a digital attenuation signal (RA) received from the backplane 118.

The received signal is at or around the Larmor frequency, and this high frequency signal is down converted in a two step process by a down converter 208 which first mixes the NMR signal with the carrier signal on line 201 and then mixes the resulting difference signal with the 2.5 MHz reference signal on line 204. The down converted NMR signal is applied to the input of an analog-to-digital (A/D) converter 209 which samples and digitizes the analog signal and applies it to a digital detector and signal processor 210 which produces 16-bit in-phase (I) values and 16-bit quadrature (Q) values corresponding to the received signal. The resulting stream of digitized I and Q values of the received signal are output through backplane 118 to the memory module 160 where they are employed to reconstruct an image.

The 2.5 MHz reference signal as well as the 250 kHz sampling signal and the 5, 10 and 60 MHz reference signals are produced by a reference frequency generator 203 from a common 20 MHz master clock signal. For a more detailed description of the receiver, reference is made to U.S. Pat. No. 4,992,736 which is incorporated herein by reference.

To properly suppress either lipid or water signals in a reconstructed SSFP image, the pulse repetition period (TR) must be very short. The LCSSFP method described in U.S. Pat. No. 6,307,368, for example, acquires two k-space image data sets using different rf pulse phase schedules during each of the two image acquisition. When the two image data sets are combined in one manner, lipid signals are suppressed, and when they are combined in another manner, the water signals are suppressed. This method works best when the phase difference of the water and fat spins is 180°, and in a SSFP pulse sequence this translates to an optimal TR of 2.2 ms when implemented in 1.5 Tesla polarizing field. Good performance has been achieved, however, with a pulse sequence repetition period (TR) of up to 3 ms.

Figure 3:
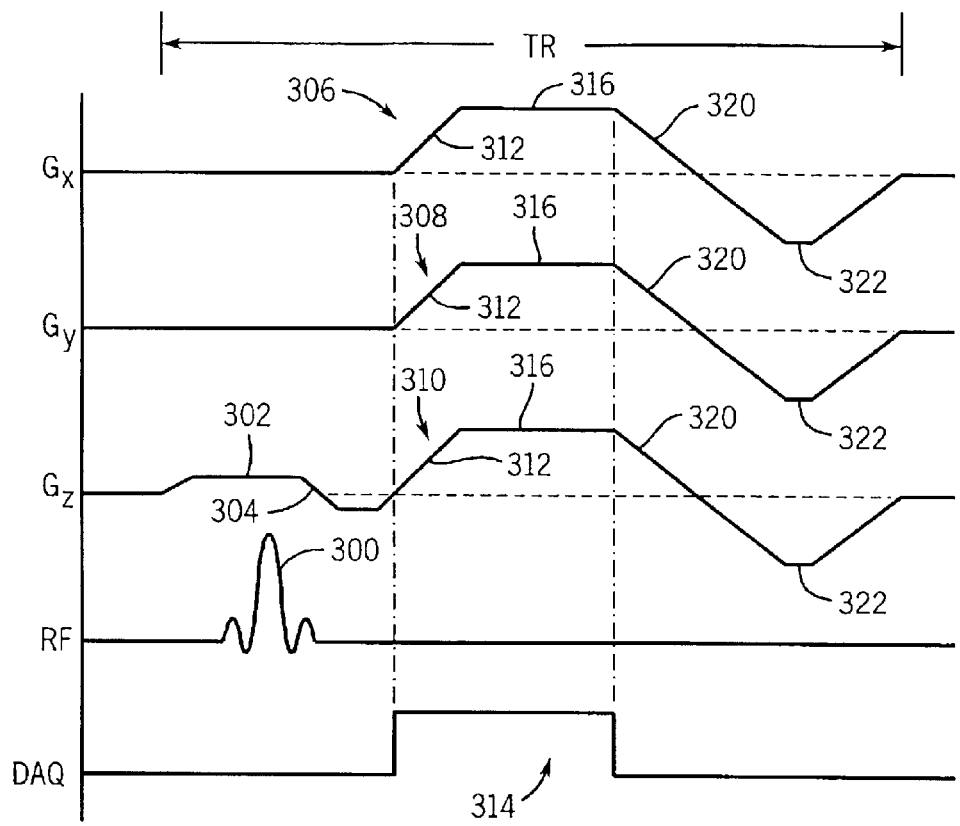
FIG. 3 is a graphic representation of a prior art pulse sequence used to acquire SSFP NMR data with the MRI system of FIG. 1.
Figure 4:
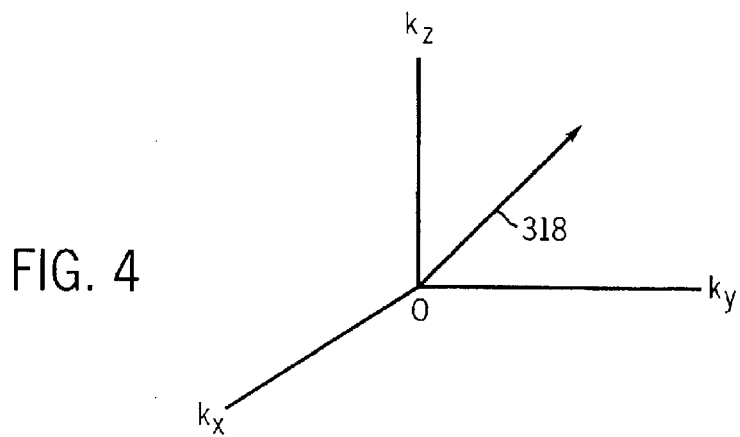
FIG. 4 is a graphic representation of the radial trajectory of k-space samples acquired with the pulse sequence of FIG. 3.

Because no separate and time consuming phase encoding gradient pulses are required, a projection reconstruction pulse sequence is employed to achieve these very short repetition periods (TR). Referring to FIG. 3, a typical 3D projection reconstruction pulse sequence includes an RF pulse 300 which is produced in the presence of a weak slab select $G_z$ gradient pulse 302 to excite spins throughout the 3D volume of interest. The excited spins are rephased by a short $G_z$ rephasing pulse 304 and then three readout gradient waveforms 306, 308 and 310 are produced along respective gradient axes $G_x$, $G_y$ and $G_z$. These readout gradient waveforms have ramp-up portions 312 during which the gradient fields rise to values required to establish the radial readout direction of the three separate fields for this particular SSFP sequence. During the scan, of course, this pulse sequence is repeated many times and the radial readout direction is stepped to different k-space directions to sample throughout a spherical volume of k-space. NMR data is acquired during the short interval indicated at 314 during which the readout waveforms 306, 308 and 310 ramp-up at 312 and maintain a flattop interval 316. As shown in FIG. 4, during this short readout interval 314 NMR signals are acquired to sample k-space along a single radial trajectory 318 that extends from the center of k-space to the periphery of the spherical volume of interest.

Following the data acquisition, the readout gradients 306, 208 and 310 are ramped down in amplitude at 320 and then ramped up again with the opposite polarity to produce rephrasing lobes 322. The negative rephrasing lobes 322 have the same area as the positive lobes such that the transverse spin magnetization is rephased before the start of the subsequent pulse sequence. Such rephrasing is required in all SSFP pulse sequences because there is significant transverse magnetization carried over from one pulse sequence to the next.

It can be seen in FIG. 3 that the sampling efficiency of this typical near-zero-TE, 3D projection reconstruction pulse sequence is low. Data is acquired over a relatively small portion of the TR time.

Figure 5:
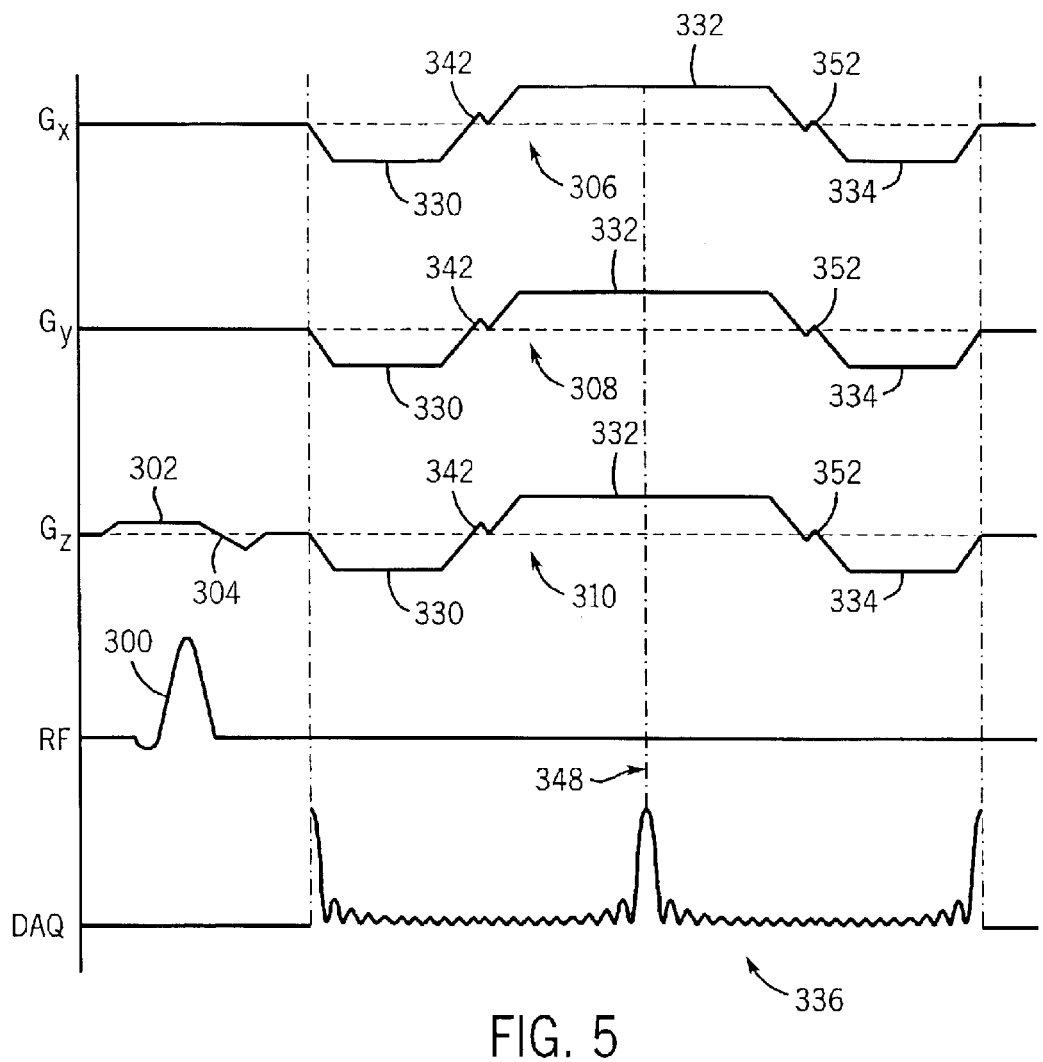
FIG. 5 is a graphic representation of a first preferred pulse sequence used to acquire SSFP NMR data according to the present invention.

Referring particularly to FIG. 5, the data gathering efficiency of a 3D projection reconstruction pulse sequence can be increased by acquiring NMR data throughout the playout of the readout gradient waveforms. In the first embodiment of FIG. 5, the readout gradient waveforms 306, 308 and 310 are comprised of an initial dephasing lobe 330, followed by a readout lobe 332 and then a rephrasing lobe 334. Unlike prior pulse sequences, NMR data 336 is acquired during the entire playout of these readout gradient waveforms 306, 308 and 310.

Figure 6:
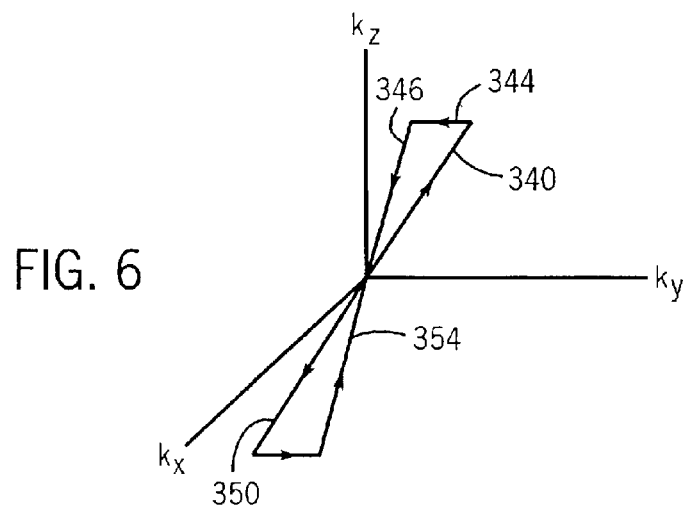
FIG. 6 is a graphic representation of the radial trajectories of k-space samples acquired with the pulse sequence of FIG. 5.

In this first embodiment four radial sampling trajectories are acquired during each pulse sequence. Referring to FIGS. 5 and 6, during the application of dephasing lobes 330 NMR data is acquired and k-space is sampled along a first radial trajectory 340. This sampling is radially outward from the center of k-space and it is performed during the ramps and plateau of the dephasing lobe 330. A small rotation gradient blip 342 is then applied to move the k-space sampling to another radial trajectory starting point as indicated by arrow 344. During the first half of the readout gradient lobe 332 NMR data is sampled along a second radial trajectory 346 back to the center of k-space. At the center of the readout gradient lobe indicated by dotted line 348, the level of each readout gradient $G_x$, $G_y$ and $G_z$ is changed slightly to redirect sampling to another radial direction. As a result, during the playout of the remaining half of the readout gradient lobe 332, k-space data is acquired along a third radial sampling trajectory 350 which is directed away from the center of k-space. NMR data is thus acquired during the playout of the entire readout lobe 332—including its ramps.

Referring still to FIGS. 5 and 6, prior to playing out the rephrasing readout gradient lobes 334 another small rotation gradient blip 352 is applied to move the k-space sampling to another radial trajectory. As a result, when NMR signal acquisition is performed during the subsequent rephrasing lobe 334, a fourth k-space sampling trajectory 354 is traversed back to the center of k-space. At the completion of the pulse sequence, therefore, a total of four different radial trajectories in k-space capable of creating isotropic 256× 256×256 pixel images have been sampled during a TR period from 3.7 ms to 4.4 ms.

Figure 7:
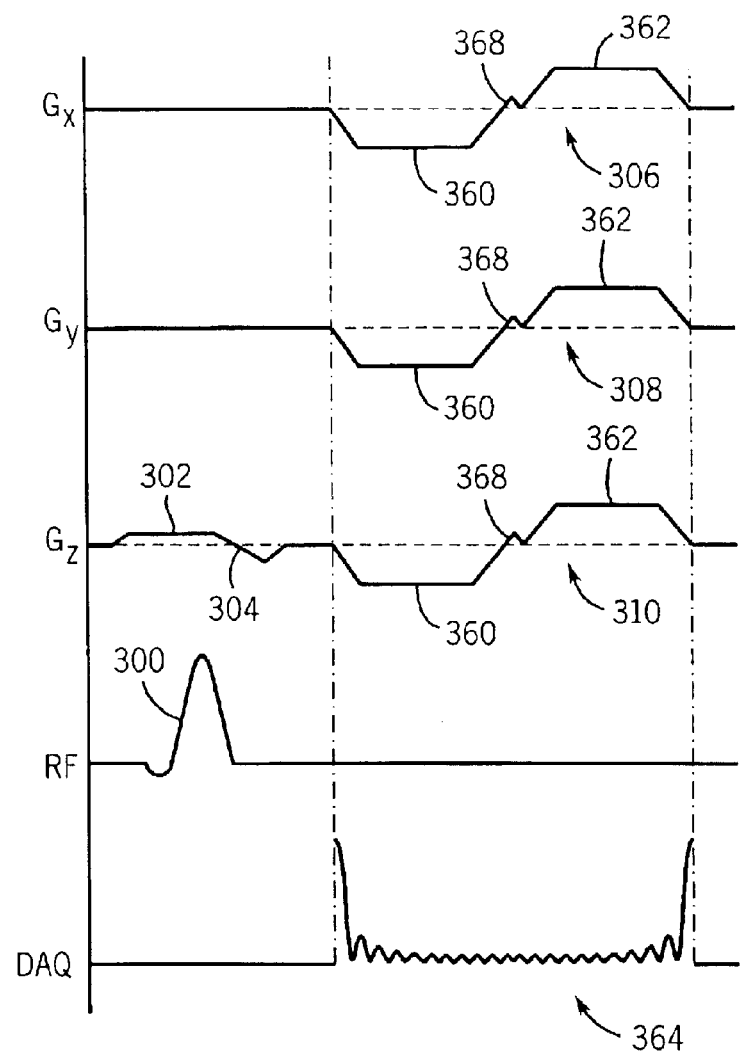
FIG. 7 is a graphic representation of a second preferred pulse sequence used to acquire SSFP NMR data according to the present invention.

Another embodiment of the 3D projection reconstruction pulse sequence is shown in FIG. 7. In this embodiment only two radial projections are acquired, but the pulse sequence can be performed in a shorter repetition period (TR) than the first embodiment described above. As with the pulse sequences described above, transverse magnetization is produced by the application of an rf excitation pulse 300 in the presence of a weak, slab-select $G_z$ gradient pulse 302. This magnetization is rephased by a small negative $G_z$ gradient lobe 304 and then the three readout gradient waveforms 306, 308 and 310 are played out.

Figure 8:
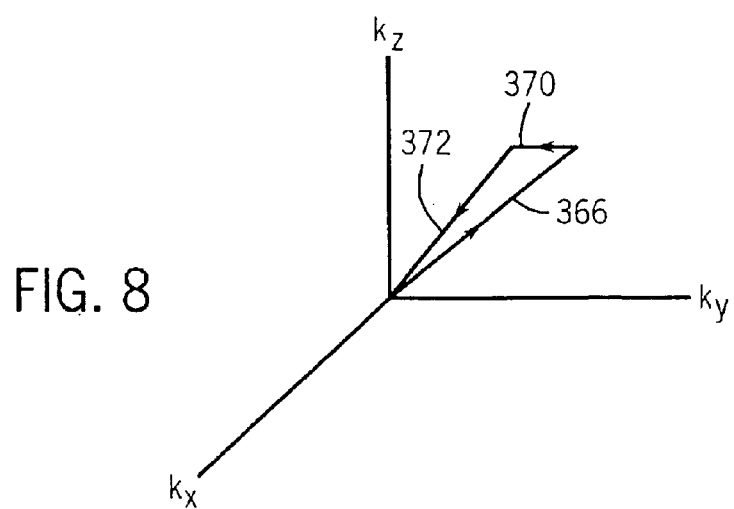
FIG. 8 is a graphic representation of the radial trajectories of k-space samples acquired with the pulse sequence of FIG. 7.

Referring still to FIG. 7, the readout gradient waveforms 306, 308 and 310 are each comprised of a dephasing lobe 360 followed by a rephrasing lobe 362. An NMR signal 364 is acquired during nearly this entire period. More specifically, during this playout of the dephasing lobe 360, including its ramps, a first readout k-space trajectory indicated by arrow 366 in FIG. 8 is sampled. A small rotation gradient blip 368 is then applied along each gradient axis $G_x$, $G_y$ and $G_z$ to move the k-space sampling to another radial trajectory starting point as indicated by arrow 370. During the subsequent rephrasing lobe 362, including its ramps, a second radial trajectory 372 is sampled back to the center of k-space.

Figure 9:
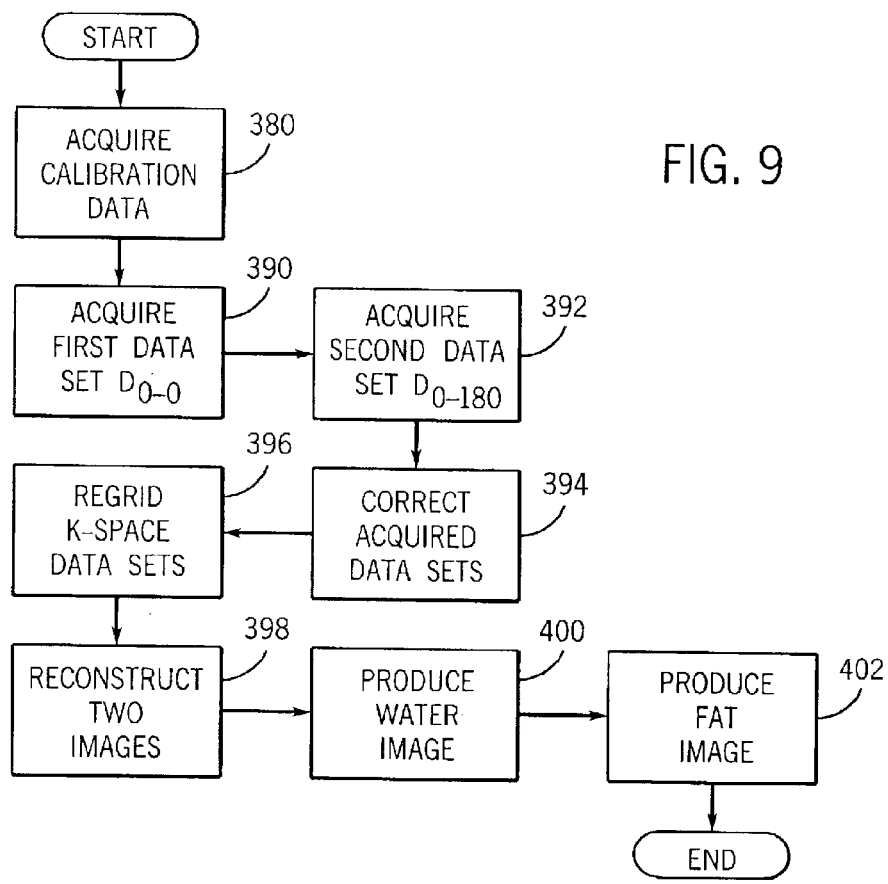
FIG. 9 is a flow chart of the preferred method for practicing the present invention.

To properly employ these efficient pulse sequences the method depicted in FIG. 9 is used. The first step in this method is to acquire calibration data for the selected readout gradient waveform as indicated by process block 380. This calibration data is needed to correct for system instabilities such as eddy currents which create errors in the actual k-space location that is being sampled while the readout gradient is being produced.

Figure 10:
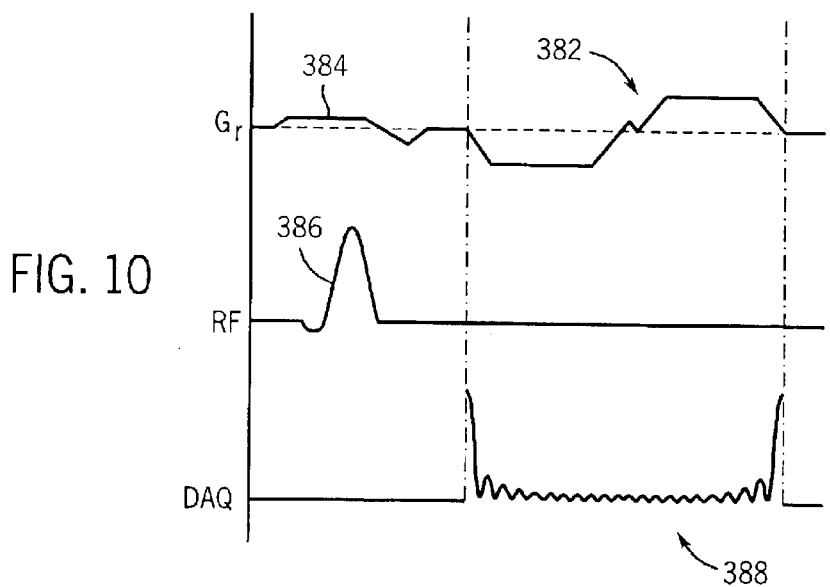
FIG. 10 is a graphic representation of a calibration pulse sequence used to practice the method of FIG. 9.

The calibration data is acquired using a pulse sequence such as that shown in FIG. 10. The readout gradient waveform to be calibrated is indicated at 382 and it is preceded by a thin slice select gradient waveform 384 directed along the same gradient axis. An RF excitation pulse 386 is produced during the application of slice select gradient 384 and the NMR signal is sampled during a window 388 as the gradient waveform 382 is played out. In this example, the readout gradient waveform being calibrated is that used in the pulse sequence of FIG. 7, and the NMR signal is sampled during the period 388 in exactly the same way it is sampled during the performance of the pulse sequence. A thin slice is excited (e.g., 1.5 mm) and this slice is located a distance (D) away from the system isocenter which is large relative to slice thickness (e.g., 30 mm).

The calibration pulse sequence is performed once for each gradient axis $G_x$, $G_y$ and $G_z$. In addition, after each acquisition the calibration pulse sequence is repeated, but with the test gradient 382 set to zero to acquire a reference NMR signal. In other words, calibration data and reference data are acquired for each orthogonal gradient axis. The phase $\phi(t)$ of the acquired calibration data and reference data for each gradient axis (x, y and z) is then calculated from the sampled quadrature components Q and I ($\phi = \tan^{-1} Q/I$). The reference phase data is then subtracted from the calibration phase data to produce three sets of corrected calibration phase data:

$$\Delta\phi_x(t) = D_x k_x(t)$$

$$\Delta\phi_y(t) = D_y k_y(t)$$

$$\Delta\phi_z(t) = D_z k_z(t),$$

where:

$D_x$, $D_y$, $D_z$ = distances of the respective calibration slices from system isocenter; and $k_x$, $k_y$, $k_z$ = location in k-space of excited spins along respective k-space axes.

In the preferred embodiment calibration data is acquired twenty times for each gradient axis and the results averaged. This step requires; 500 to 1,000 ms of acquisition time.

Referring again to FIG. 9, a first image data set $D_{0-0}$ is then acquired as indicated at process block 390 using one of the 3-D projection reconstruction pulse sequences described above and shown in FIG. 5 or 7. In both preferred embodiments described above the pulse sequences are repeated to sample radial trajectories along many different trajectories until the entire 3D k-space volume is sampled to the prescribed density. This is accomplished by modulating the relative amplitudes of the respective readout gradient waveforms $G_x$, $G_y$ and $G_z$. The angular spacing is chosen such that a uniform distribution of k-space sample points occurs at the peripheral boundary ($k_{max}$) of the sampled k-space sphere. The acquisition is done on a 1.5 T scanner with a 40 mT/m maximum peak gradient amplitude and a 150 mT/m/s maximum slew rate. A receiver bandwidth of ±125 kMz was used to achieve the shortest TR possible. A readout resolution equivalent to 128 radial k-space sample points was used for each radial trajectory, giving an equivalent image matrix size of 256×256×256. The set of radial trajectories for this first data set is acquired with a constant RF phase cycle and the resulting k-space data set is denoted $D_{0-0}$. The center frequency for the exam is set halfway between the fat and water resonance peaks.

A second image data set $D_{0-180}$ is then acquired as indicated at process block 392. This data set is acquired in the identical fashion as the first data set, except the RF phase is incremented each TR by a $\pi$ phase increment. The resulting two data sets $D_{0-0}$ and $D_{0-180}$ provide sufficient information to produce separate water and fat images.

As indicated at process block 394, the next step is to correct the k-space data sets $D_{0-0}$ and $D_{0-180}$ for sampling position errors using the three sets of calibration phase data $\Delta\phi_x(t)$, $\Delta\phi_y(t)$, $\Delta\phi_z(t)$. First, the actual k-space location from which NMR signals are sampled during a projection acquisition along each of the gradient axes x, y and z is calculated:

$$k_x(t) = \Delta\phi_x(t)/D_x$$

$$k_y(t) = \Delta\phi_y(t)/D_y$$

$$k_z(t) = \Delta\phi_z(t)/D_z.$$

These corrected k-space sampling points for each gradient axis are then combined to provide the actual sampling points $k_{actual}(t)$ for each acquired sampling trajectory by calculating the following dot product:

$$k_{actual}(t) = [k_{xmax} \ k_{ymax} \ k_{zmax}] \cdot \begin{bmatrix} k_x(t) \\ k_y(t) \\ k_z(t) \end{bmatrix}$$

where: $k_{xmax}$, $k_{ymax}$, $k_{zmax}$ = are the endpoints of the acquired sampling trajectory on a unit circle. For example, if the acquired sampling trajectory is directed along the x-axis only, $k_{xmax}$ is "1" and the $k_{ymax}$ and $k_{zmax}$ values are zero. In this case the actual sampling points $k_{actual}(t) = k_x(t)$. Of course, nearly all the acquired sampling trajectories are directed along 2 or 3 gradient axes and the actual sampling points $k_{actual}(t)$ are a combination of the three corrected k-space sampling points $k_x(t)$, $k_y(t)$ and $k_z(t)$.

This correction of the acquired k-space data set is performed on each trajectory to produce an acquired and corrected k-space data set. It should be apparent, however, that this correction does not actually alter the sampled NMR signals, but instead, correctly identifies the locations in k-space from which the samples were actually obtained. The actual implementation of these corrections occurs in the regridding process which follows.

In the preferred image reconstruction method, a regridding step is then used as indicated at process block 396 to place the acquired and corrected k-space data set on a 3D Cartesian grid. This is done so that a 3DFT image reconstruction can be performed. Such regridding methods are well known in the art and is described, for example, in J. Jackson et al, "Selection Of Convolution Function For Fourier Inversion Using Gridding," IEEE Trans. Med. Imaging, 10, 473–478, 1991. This regridding step is performed with the actual sampling trajectories $k_{actual}(t)$ rather than the theoretical radial sampling trajectories. The interpolation process that characterizes the regridding of radial sample points to Cartesian sampling points thus employs the actual sample points $k_{actual}(t)$ for each trajectory. The resulting 3D array of k-space data are density compensated with a $\rho^2$ filter, where $\rho$ is the k-space radius of the data point being compensated. The $\rho=0$ point is weighted according to the finite sphere of volume that it samples, similar to the correction proposed for 2D projection filters. The kernel used for the regridding process is either a simple triangle function, which is computationally very fast, or a Kaiser-Bessel function, which has the advantage of reducing aliased energy from the regridding process.

As indicated at process block 398 the two regridded k-space data sets are then Fourier-transformed in all three directions to reconstruct two images $I_{0-0}$ and $I_{0-180}$. In the preferred embodiments each sampled radial trajectory extends from the center to the periphery of the k-space volume in only one direction but samples in the opposite direction are not acquired. The missing data is synthesized with a 3D homodyne process such as that described by Noll and Nishimura, "Homodyne Detection In Magnetic Resonance Imaging," IEEE Transactions on Medical Imaging, Vol. 10, No. 2, June 1991 and in U.S. Pat. No. 5,243,284.

As indicated by process blocks 400 and 402 the final steps in the method is to combine the two complex image data sets $D_{0-0}$ and $D_{0-180}$ so to produce a water image and a fat image. The water image suppresses fat signal and is formed by combining the two image data sets as follows. First, the phase of each element in the complex image data set $I_{0-180}$ is phase shifted $-90°$. Then, this phase shifted complex image $D_{0-180}(e^{-i\pi/2})$ is added to the complex image data set $D_{0-0}$ by summing the respective I and Q components of each corresponding data set element. The water image is formed by calculating a magnitude image from the result. The fat image is formed by combining the two image data sets as follows. First, the phase of each element in the complex image data set $D_{0-180}$ is phase shifted $+90°$. Then, this phase shifted complex image $D_{0-180}(e^{i\pi/2})$ is added to the complex image data set $D_{0-0}$ by summing the respective I and Q components of each corresponding data set element. The fat image is formed by calculating a magnitude image from the result.

While both a water image and a fat image may be produced, in most clinical applications the water image is used. More specifically, the three-dimensional water image may be examined by taking two-dimensional slices through the three-dimensional image to examine specific anatomy. Or, the 3-D image may be projected on to a two-dimensional image plane at a selected projection angle using a well known projection technique.

The present invention is not limited to the preferred method of producing a fat-suppressed water image described above. For example, other RF phase cycling schemes can be used when acquiring the two image data sets and the acquired data sets can be combined in k-space prior to image reconstruction to suppress fat or water. The Homodyne reconstruction method is preferred because it reduces the amount of k-space data needed, but it is not necessary to practice the invention.

What is claimed is:

1. A method for producing an image with a magnetic resonance imaging (MRI) system the steps comprising:
   a) performing a calibration pulse sequence with the MRI system using a selected readout gradient waveform to acquire calibration data;
   b) acquiring a first k-space data set with the MRI system using a three-dimensional projection reconstruction pulse sequence that produces the selected readout gradient waveform during data acquisition, and that employs a first RF pulse phase pattern;
   c) acquiring a second k-space data set with the MRI system using the three-dimensional projection reconstruction pulse sequence that produces the selected readout gradient waveform during data acquisition, and that employs a second RF pulse phase pattern;
   d) correcting the first and second k-space data sets using the calibration data; and
   e) producing a water image from the first and second corrected k-space data sets.

2. The method as recited in claim 1 in which step e) is performed by
   i) reconstructing a first image from the first corrected k-space data set;
   ii) reconstructing a second image from the second corrected k-space data set; and
   iii) combining data from the first and second images.

3. The method as recited in claim 1 in which the selected readout gradient waveform is comprised of a plurality of lobes connected by a ramp and k-space data is acquired substantially throughout the production of the selected readout gradient waveform.

4. The method as recited in claim 3 in which the selected readout gradient waveform includes a plurality of ramps and k-space data is acquired during the production of said ramps.

5. The method as recited in claim 1 in which the calibration pulse sequence includes:
   i) producing a selective RF excitation pulse in the presence of a slice select gradient directed along a gradient axis;
   ii) producing the selected readout gradient waveform along the same gradient axis; and
   iii) acquiring calibration data during substantially all of the production of the selected readout gradient waveform.

6. The method as recited in claim 5 in which the calibration pulse sequence is performed three times with the gradient axis directed in three respective orthogonal directions.

7. The method as recited in claim 6 which includes acquiring reference data for each gradient axis by repeating the calibration pulse sequence without producing said selected readout gradient waveform; and
combining the reference data with the calibration data.

8. The method as recited in claim 7 in which the phase of the acquired calibration data and corresponding acquired reference data are calculated and the reference data is combined with the calibration data by subtracting the reference phase data from the corresponding calibration phase data.

9. The method as recited in claim 1 in which the selected readout gradient waveform is shaped such that k-space is sampled along four different radial sampling trajectories during the performance of said three-dimensional projection reconstruction pulse sequence.

10. The method as recited in claim 9 in which the selected readout gradient waveform includes three lobes of alternating polarity and each lobe is bounded by a pair of ramps.

11. The method as recited in claim 10 in which the bounding ramps of the second lobe are connected to ramps that bound the respective first and third lobes by rotation gradient blips.

12. The method as recited in claim 1 in which the selected readout gradient waveform includes two lobes of alternating polarity, each bounded by ramps, and a ramp of the first lobe is connected to a ramp of the second lobe by a rotation gradient blip.

13. The method as recited in claim 12 in which the data is acquired during the performance of the three-dimensional projection reconstruction pulse sequence during the production of both lobes and associated ramps of said selected readout gradient waveform.

14. The method as recited in claim 1 which includes regridding the acquired first and second k-space data sets to form Cartesian data sets prior to performing step e) and step d) includes calculating the actual k-space sampling locations for use in the regridding step.

15. The method as recited in claim 14 in which step d) includes calculating the phase of the acquired calibration data.

* * * * *